(12) United States Patent
Koidl et al.

(10) Patent No.: US 6,536,509 B1
(45) Date of Patent: Mar. 25, 2003

(54) DIAMOND BODY

(75) Inventors: Peter Koidl, Denzlingen (DE); Christof Wild, Denzlingen (DE); Eckhard Worner, Freiburg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/341,508
(22) PCT Filed: Dec. 20, 1997
(86) PCT No.: PCT/DE97/03004
§ 371 (c)(1),
(2), (4) Date: Jul. 12, 1999
(87) PCT Pub. No.: WO98/32171
PCT Pub. Date: Jul. 23, 1998

(30) Foreign Application Priority Data

Jan. 18, 1997 (DE) .......................................... 197 01 680

(51) Int. Cl.$^7$ ................................................ H05K 7/20
(52) U.S. Cl. ........................ 165/81; 165/185; 361/704
(58) Field of Search .................... 165/185, 81; 361/704, 361/710; 257/712, 720

(56) References Cited

U.S. PATENT DOCUMENTS

| | | | | |
|---|---|---|---|---|
| 3,301,356 A | * | 1/1967 | Pompa ........................ | 188/218 |
| 4,535,384 A | * | 8/1985 | Wakabayashi et al. ..... | 165/80.3 |
| 4,781,424 A | * | 11/1988 | Kawachi et al. ........... | 350/96.3 |
| 5,043,796 A | | 8/1991 | Lester | |
| 5,146,314 A | * | 9/1992 | Pankove ..................... | 165/80.4 |
| 5,690,279 A | * | 11/1995 | Kramer et al. ........... | 239/127.3 |

FOREIGN PATENT DOCUMENTS

| | | |
|---|---|---|
| EP | 0538798 | 10/1992 |
| EP | 0630045 | 6/1994 |
| EP | 0715352 | 11/1995 |
| JP | 57060861 | 9/1980 |
| JP | 63-140556 | 1/1986 |
| WO | WO 94/24703 | 3/1993 |

OTHER PUBLICATIONS

Horvath et al., Metal Cooling Fins for a Semiconductor Package, Dec. 1983, IBM Tech. Disclosure Bulletin vol. 26 No. 7A.*
Ralchenko, V.G. et al.; Processing of CVD Diamond with UV and Green Lasers; Third Conference 1995, General Physics Institute; Moscow, Russia.
Boudreaux, P.J.; Thermal Aspects of High Performance Packaging with Synthetic Diamond; 3rd International Conference 1995; Laboratory for Physical Sciences, USA.
Malshe, A.P.; Recent Advances in Diamond Based Mulitchip Modules (MCMs); 3rd International Conference 1995; High Density Electronics Center, USA.
Ralchenko, V.G.; Thermal Stress in Diamond Films; 3rd International Confernce 1995; Institute of General Physics; Russia.

(List continued on next page.)

Primary Examiner—Allen Flanigan
(74) Attorney, Agent, or Firm—Baker & Daniels

(57) ABSTRACT

The invention concerns a diamond body designed to enable thermal contacting with at least one source of heat (30) and presenting at least one recess (13, 15) defining an angular position in relation to the mechanical tensions generated by said or any source of heat (30). Consequently, the mechanical tensions generated at various temperatures, either, for example, by various expansion coefficients of the diamond body (12) or by the source of the heat (30) featured by one semi-conductor component, are at least partly compensated, resulting in the possibility to take advantage of the exceptional thermoconductive capacity and insulating characteristics of the diamond, including diamond bodies (12) of a relatively big size.

8 Claims, 6 Drawing Sheets

OTHER PUBLICATIONS

Kühltechnik; Mit Diamant gegen heiBe Chips; Elektronik 1995.

Fiegl, B; Diamond Films as Thermal Conductors and Electrical Insulators Applied to Semiconductor Power Modules; Diamond Related Materials 1994, Germany.

Yonhua, T.; CVD Diamond Heat Rejection Module with Built–In Cooling Channels; 2nd International Conference 1993; Japan.

Lu, G.; Applications of CVD Diamonds in Thermal Management; 2nd International Conference 1993; Japan.

Reeves, G; Temperature Distribution in GaAs Lasers with Diamond Film Heatsink; Electronics Letters Dec. 3, 1992 vol. 28 No. 25.

Ramesham, R.; Fabrication of Microchannels in Synthetic Polycrystalline Diamond Thin Films for Heat Sinking Applications; Journal of the Electrochemical Society 138 Jun. 1991 USA.

* cited by examiner

DIAMOND BODY

TECHNICAL FIELD

The invention concerns a diamond body for connection to at least one component.

BACKGROUND ART

It is known from the article "Diamond Films as Thermal Conductors and Electrical Insulators Applied to Semiconductor Power Modules" by B. Fiegl, R. Kuhnert, H. Schwarzbauer and F. Koch in Diamond and Related Materials, 3 (1994, pages 658 to 662 that diamond bodies can be used to remove large amounts of heat, for example, from semiconductor components as heat sources, because of the very high thermal conductivity of diamond.

As known from the article "Applications of CVD Diamond in the Thermal Management" by G. Lu in $2^{nd}$ International Conference on the Applications of Diamond Films and Related Materials, Editors M. Yoskikawa, M. Murakawa, Y. Tzeng and W. A. Yarbrough, MY, Tokyo, 1993, large amounts of heat can also be quickly taken off with so-called heat spreading, i.e., effective spatial distribution of the heat, with diamond plates deposited from the gas phase as diamond bodies based on the high thermal conductivity, especially from point heat sources.

However, as is known from the article "Thermal Stress in Diamond Films" by V. G. Ralchenko, E. D. Obraztova, K. G. Korotoushenko et al. in Applications of Diamond Films and Related Materials: Third International Conference, 1995, Editors A. Feldman, Y. Tzeng, W. A. Yarbrough et al., the problem then occurs that because of the very low heat expansion coefficient of diamond, significant thermally induced mechanical stresses sometimes occur during connection to other materials, like semiconductors or metals by soldering and during operation, generally at room temperature, which, under some circumstances, can disadvantageously lead to destruction of the connection or the diamond body.

It was previously proposed, to reduce such thermally induced mechanical stresses in conjunction with applied components, to provide a thick, soft solder layer during connection of a diamond body to components, in order to compensate for the thermally induced mechanical stresses via their elasticity in the soldered joint. However, a shortcoming of this procedure is that the heat resistance is substantially increased on this account, so that heat removal is reduced, especially during heat spreading.

DISCLOSURE OF INVENTION

The underlying task of the invention is to devise a diamond body of the type mentioned at the outset, in which the hazard of loosening of a connection to other, especially relatively inelastic materials, or destruction of the diamond body because of thermally induced mechanical stresses, especially during joining with exposure to heat, is reduced.

This task is solved in a diamond body of the type mentioned at the outset in that at least one elongated recess is made, which extends at an angle to thermally induced mechanical stresses from the connection with the component or each component.

By provision of at least one elongated recess in the diamond body, which extends at an angle to thermally induced mechanical stresses during temperature differences, for example, during connection of the diamond body to the component with exposure to heat and room temperature or, under some circumstances, also between an operating state with very high temperature and a rest state, these stresses are at least partially compensated by the obliquely aligned recess or each obliquely aligned recess, because of the increase in mobility of the diamond body achieved by this, so that the hazard of, say, flaking off of the diamond body is substantially reduced, but the utilized properties of diamond, like very good electrical insulation behavior or excellent thermal conductivity, are essentially retained.

Preferably, a number of resources are provided, which are preferably aligned at right angles to the mechanical stresses. It is then expedient that the recesses be aligned under a small angle to the heat flow directions established by the geometry of the diamond body, as well as the arrangement of heat sources and heat sinks formed by the component or each component. It is particularly advantageous if a number of recesses run essentially at right angles to mechanical stresses and essentially parallel to the heat flow directions.

In one embodiment a number of recesses are designed as inner slits that are open to the two surfaces of the diamond body. In other embodiments the recesses are designed as slits open to three surfaces, in which the corresponding residual material thickness to an edge side adjacent to the end of the slit is smaller than the depth of each slit. Particularly high equalization of thermally induced mechanical stresses in conjunction with narrow elongated components is achieved because of this, in which it is expedient for this case for good heat spreading that parallel slits be provided aligned transversely to an elongated heat source or heat sink.

With a grid-like arrangement of several point-like heat sources or heat sinks as components, it is advantageous to arrange the recesses to extend between adjacent heat sources and to enclose each heat source, in order to spread the generated heat over a larger surface area, on the one hand, and to locally compensate for mechanical stresses generated in the region of each heat source, on the other hand.

Components, like semiconductor lasers or computer components, to be joined with solder, especially even at relatively high temperatures, can be applied with diamond bodies so configured without the hazard of separations, breaks, and/or deformations of the applied components or diamond bodies, in which a very thin solder layer with a corresponding limited heat resistance can be used advantageously, owing to compensation of the mechanical stresses by the recesses.

These and other objects and advantages of the present invention will become clear to those skilled in the art in view of the description of the best presently known mode of carrying out the invention and the industrial applicability of the preferred embodiment as described herein and as illustrated in the several figures of the drawings.

BRIEF DESCRIPTION OF THE DRAWINGS

The purposes and advantages of the present invention will be apparent from the following detailed description in conjunction with the appended drawings in which:

FIG. 1 shows, in a perspective view, a diamond body 1 processed from one piece, which has a flattened, cuboid shape. Diamond body 1 has a first edge side 2, a second edge side 3 opposite the first edge side 2, a third edge side 4 extending between the first edge side 2 and the second edge side 3, as well as a fourth edge side 5 opposite a third edge side 4, which form the continuous edge surface of the diamond body 1. Moreover, diamond body 1 has a first cover side 6 visible in the depiction according to FIG. 1 and a second cover side 7 opposite the first cover side 6, which form the cover surfaces of the diamond body 1.

Figure 1:
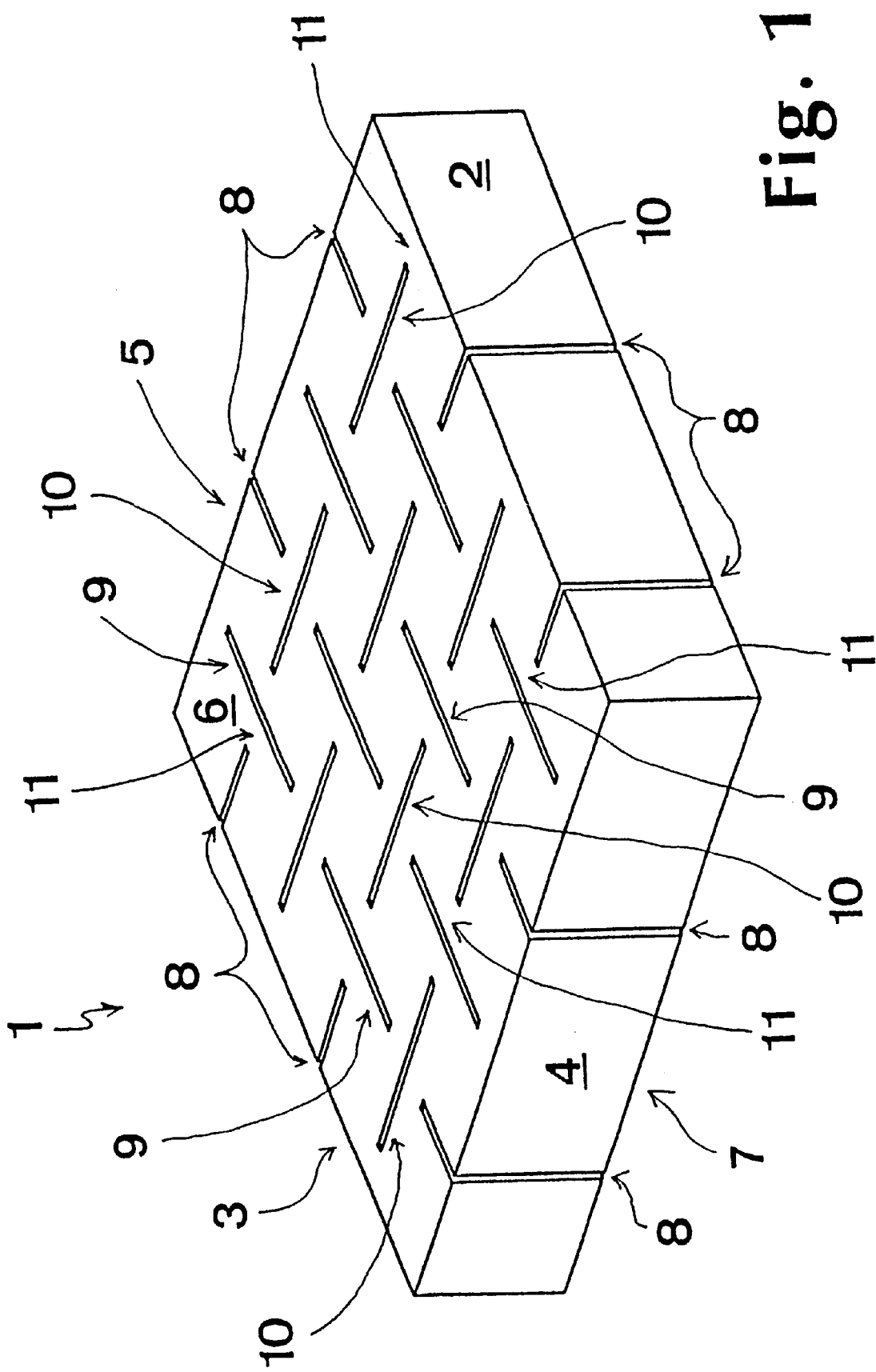
FIG. 1 shows a flattened, cuboid diamond body with recesses made on the edge side and internally in a perspective view.

The diamond body 1 depicted in FIG. 1 has a number of short edge slits 8 as first group of recesses extending between cover sides 6, 7 and open to one of the edge sides 2, 3, 4, 5. The short edge slits 8 are designed elongated and aligned essentially at right angles to the edge sides 2, 3, 4 5, to which they are opened.

A second group of elongated recesses, parallel first internal slits 9 are introduced in the diamond body 1 depicted in FIG. 1, only some of which are provided with reference numbers for reasons of clarity. The diamond body 1 also has elongated second internal slits 10 aligned at right angles to the first internal slits 9, only some of which are provided with the corresponding reference numbers for reasons of clarity. The internal slits 9, 10 extend opened between the cover sides 6, 7 and are closed on their ends facing the edge sides 2, 3, 4, 5. The first internal slits 9 are aligned parallel in groups to the first edge side 2 and the second edge side 3 and at regular spacing. Each second internal slit 10 is arranged between two adjacent first internal slits 9 and runs parallel to the third edge side 4, as well as the fourth edge side 5, with its adjacent second internal slits 10 aligned in the longitudinal direction.

It is expedient to arrange the internal slits 9, 10 so that they have regular spacings and thus a highly symmetric structure. The length of the edge slit 8, as well as internal slits 9, 10, is adjusted so that the residual material thickness 11, provided with reference numbers in selected locations, to an internal slit 9, 10 adjacent to the corresponding slit end is smaller than the length of the edge slit 8 or internal slits 9, 10.

The diamond body 1 depicted in FIG. 1 as practical example is suitable, in particular, for joining with point-like heat sources or heat sinks as components, which are symmetrically enclosed by two pairs of internal slits 9, 10. The diamond body 1 is also advantageously joinable with components formed by a plate extending essentially over the entire surface of diamond body 1, which is joined to the diamond body 1 with point-like connections enclosed by internal slits 9, 10, and has a significant temperature difference of, say, a few hundred degrees in two operating states, the diamond body 1 in this case being primarily used as electrical insulator. By the provision of internal slits 9, 10 and also edge slit 8, the mechanical stresses produced in the diamond body 1, because of the temperature difference in the two operating states of the component, are compensated, so that deformations, damage or breaks of the component and/or the diamond body 1 are avoided.

Figure 2:
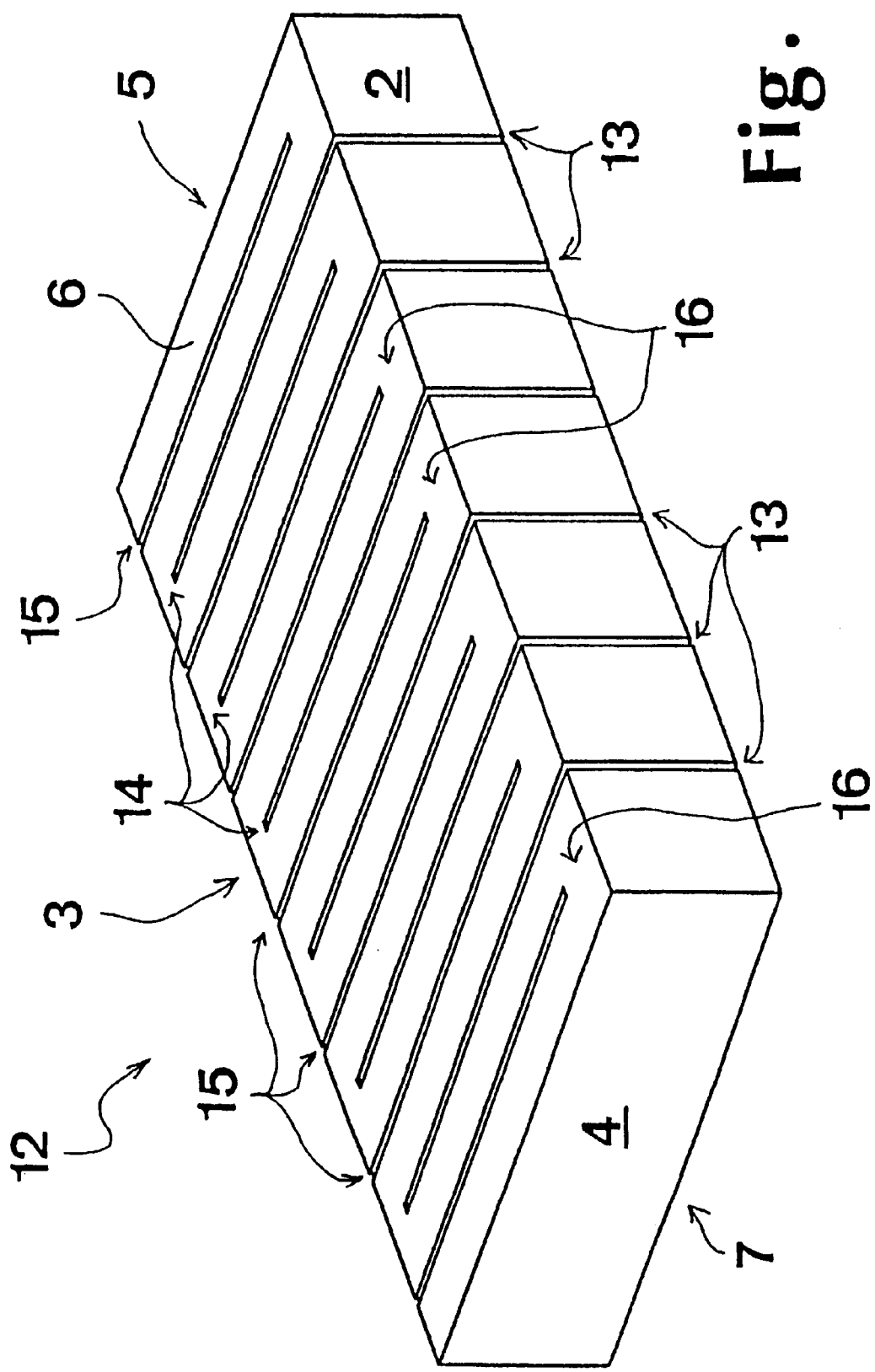
FIG. 2 shows a flattened, cuboid diamond body with recesses arranged parallel and introduced from two edge sides in a perspective view.

FIG. 2 shows, in a perspective view, another practical example of a flattened, cuboid diamond body 12 with edge sides 2, 3, 4, 5 and cover sides 6, 7 aligned parallel to each other in pairs. The diamond body 12 depicted in FIG. 2 has, as first group of elongated recesses, first longitudinal edge slits 13, which extend from the first edge side 2 parallel to the third edge side 4 and fourth edge side 5 in the direction of the second edge side 3 lying opposite the first edge side 2 and are open to the two edge sides 6, 7. The residual material thickness 14 remaining between the end of the first longitudinal edge slits 13 facing the second edge side 3 and the second edge side 3 is much smaller than the length of the first longitudinal edge slits 13. The first longitudinal edge slits 13 are at regular spacing and aligned parallel to each other.

Second longitudinal edge slits 15 opened to both cover sides 6, 7 extend in the center between two adjacent first longitudinal edge slits 13, starting from the second edge side 3 in the direction of the first edge side 2 as second group of elongated recesses, in which a much smaller second residual material thickness 16 also remains between the end of the second longitudinal edge slits facing the first edge side 2 relative to the length of the second longitudinal edge slits 15. To impart different compensation properties to the diamond body 12 on the first edge side 2 and second edges side 3, it is expedient that the longitudinal edge slits 13, 15 be of different lengths, so that different residual material thicknesses 14, 16 remain.

The diamond body 12 depicted in FIG. 2 can also be produced from one piece and has a meander-like structure, which leads to a particularly effective compensation of thermally induced mechanical stresses in elongated heat sources or heat sinks as components applied across the trend of the longitudinal edge slits 13, 15.

Figure 3:
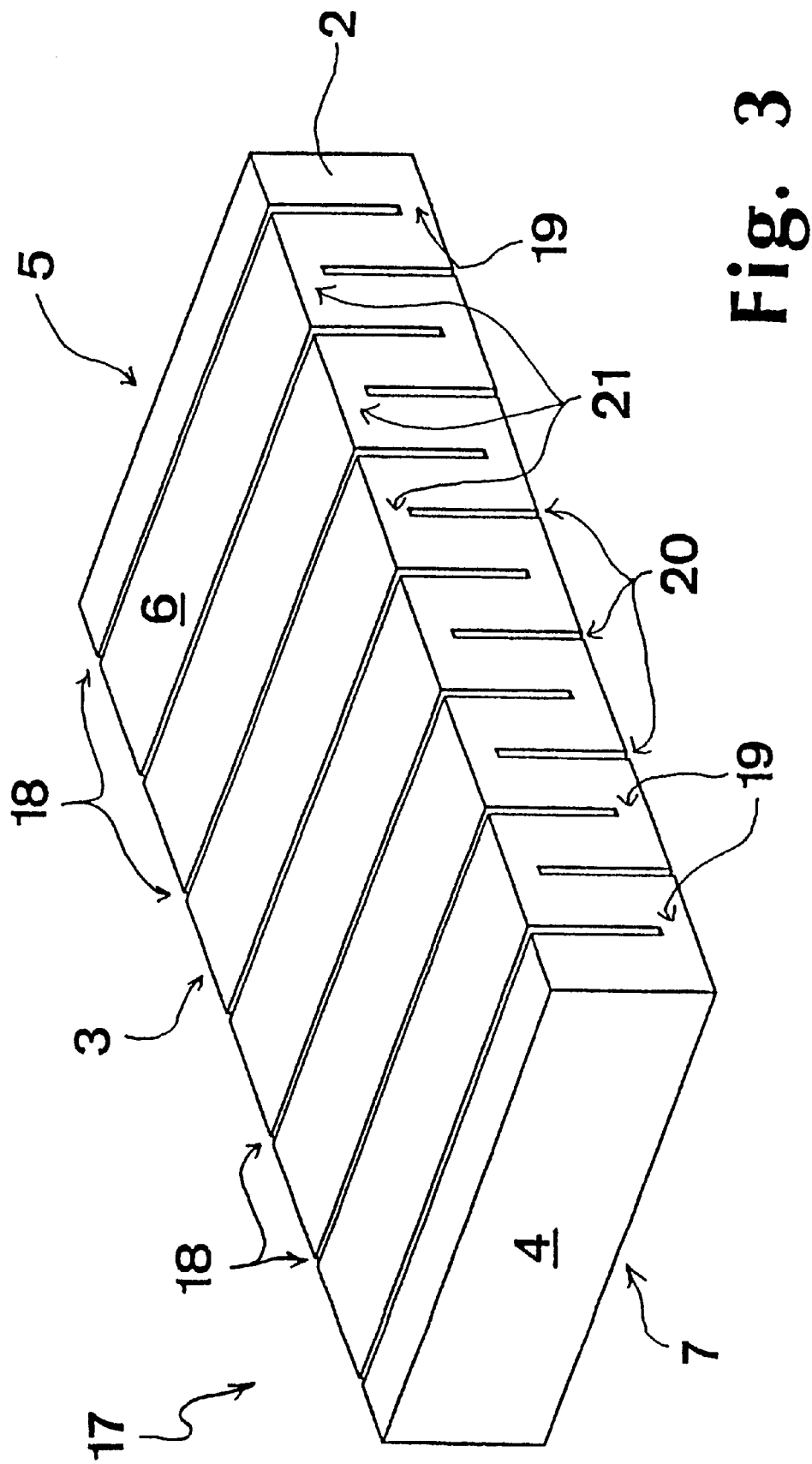
FIG. 3 shows a flattened, cuboid diamond body with recesses aligned parallel and introduced from two cover sides in a perspective view.

FIG. 3 shows, in a perspective view, another practical example of a flattened, cuboid diamond body 17 with edge sides 2, 3, 4, 5 and cover sides 6, 7 designed according to the diamond bodies 1, 12 depicted in FIGS. 1 and 2. In the diamond body 17 depicted in FIG. 3, a number of first groove slits 18 open to the first edge side 2 and the second edge side 3 are applied as first group of elongated recesses extending from the first cover side 6 in the direction of the second cover side 7 running parallel to the third edge side 4 and the fourth edge side 5. The first groove slits 18 are at regular spacing and have a depth that is greater than the first residual material thickness 19 remaining between its groove end facing the second cover side 7 and the second cover side 7.

Moreover, in the diamond body 17 depicted in FIG. 3, a number of second groove slits 20 open to the first edge side 2 and the second edge side 3 are introduced as second group of elongated recesses extending from the second cover side 7 in the direction of the first cover side 6, running parallel to the third edge side 4 and the fourth edge side 5 in the center between adjacent first groove slits 18. The depth of the regularly spaced second groove slits 20 is also adjusted, so that it is greater than the second residual material thickness 21 remaining between the groove end of the second groove slit 20 facing the first cover side 6, and the cover side 6. The diamond bodies 1, 12, 17 depicted in FIGS. 1 to 3 are preferably made from synthetically produced polycrystalline diamond wafers with a thickness of a few hundred $\mu m$ between the cover sides 6, 7 and the edge lengths of the edge sides 2, 3, 4, 5 of up to a few centimeters. The width of the recesses 8, 9, 10, 13, 15, 18, 20 lies in the range of a few tens of micrometers, the distance between adjacent short edge slits 8, internal slits 9, 10, longitudinal edge slits 13, 15 and groove slits 18, 20 lies in the range of a few hundred μm. Typical values for the residual material thicknesses 11, 14, 16, 19, 21 also lie in the range of a few hundred μm.

Figure 4:
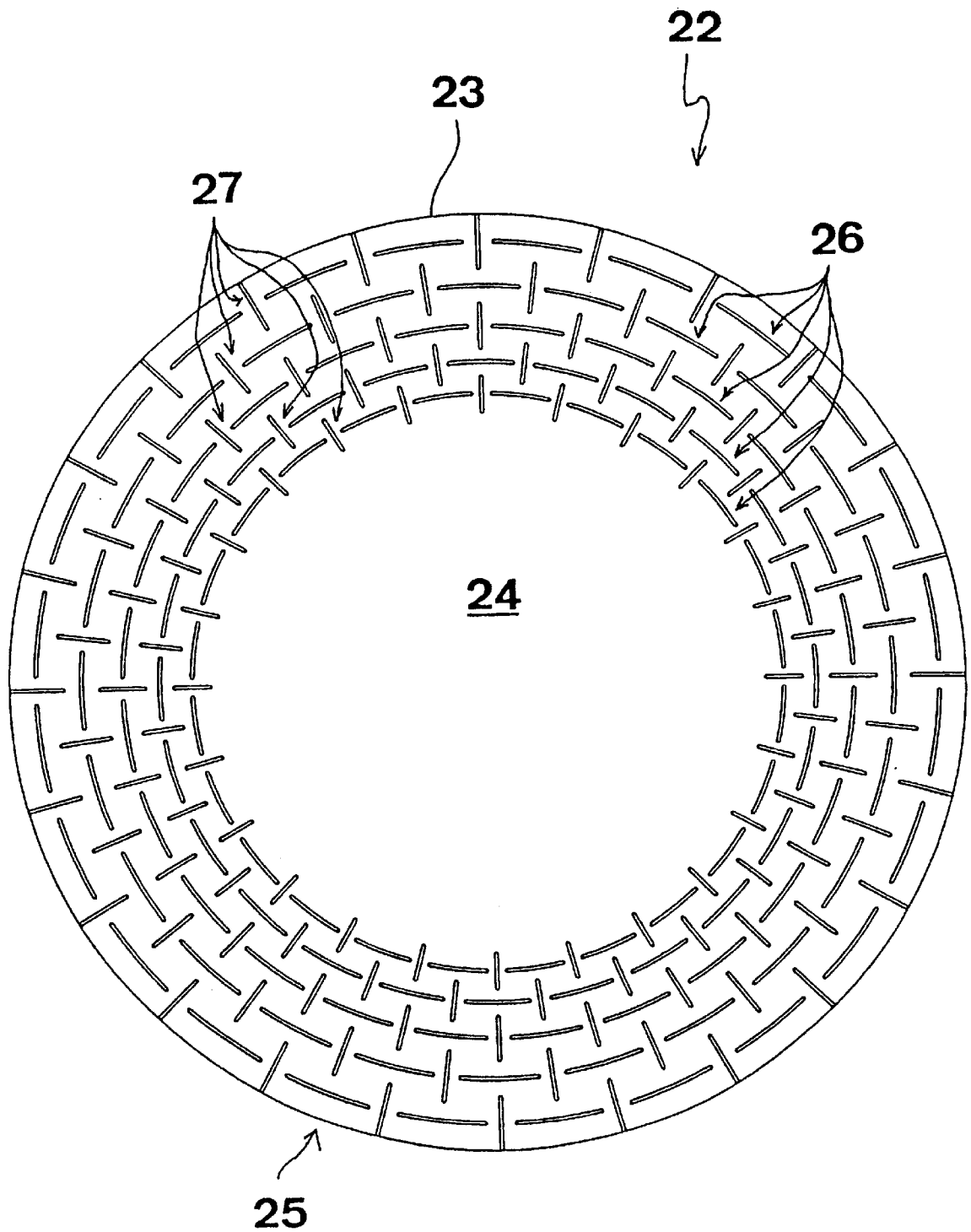
FIG. 4 shows recesses arranged to run lengthwise and crosswise on peripheral lines in a round diamond body in a cover view.

FIG. 4 shows, in a cover view, a flattened, wafer-like diamond body 22 having a cylindrical edge side 23, as well as a first cover surface 24 visible in the depiction according to FIG. 4, and a second cover surface 25 opposite the first cover surface 24 and running parallel to it. The diamond body 22 depicted in FIG. 4 has as first group of elongated recesses annular slits 26 arranged on concentrically lying circular peripheral lines, which extend in sections along five circular peripheries of the diamond body 22 depicted in FIG. 4. Annular slits 26 arranged on the next upper circular peripheries then extend in the same annular slit angular segment, in which the individual annular slit angular segments are separated from each other by the same spacing angle.

Moreover, the diamond body 22 depicted in FIG. 4 has as second group of elongated recesses a number of radially running radial slits 27 arranged between adjacent annular slits 26, which are arranged in the center on the concentrically arranged circular peripheral lines, along which the annular slits 26 extend, in which the radial slits 27 arranged on the circular peripheral line with the greatest diameter are open to the edge side 23.

The diamond body 22 depicted in FIG. 4 is especially provided as a heat spreader for use with a heat source or heat sink as component in the center and a metal ring mounted on the edge side 23 for heat removal or heat supply.

Figure 5:
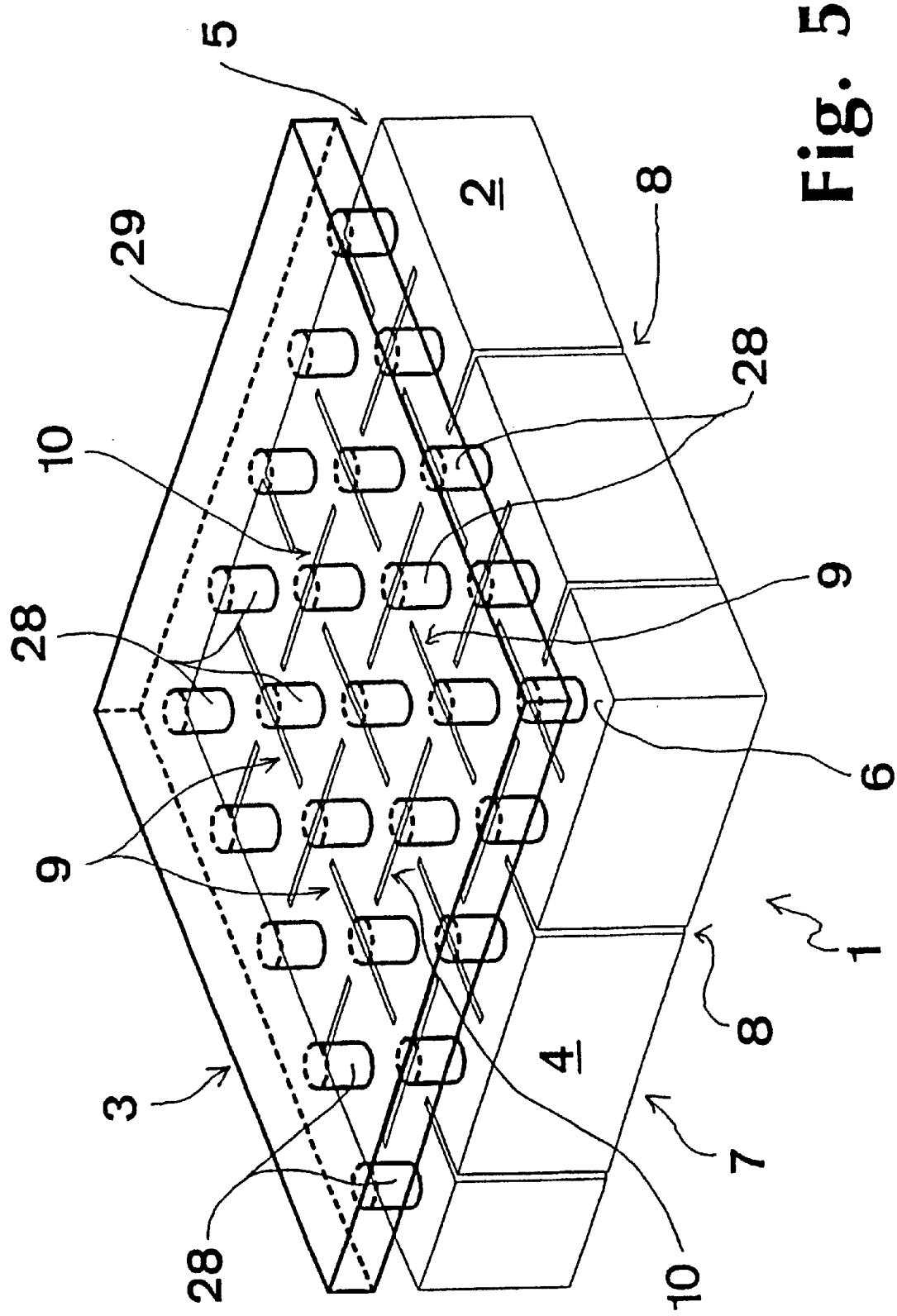
FIG. 5 shows the arrangement of heat sources as components in a diamond body according to FIG. 1 in a perspective view.

FIG. 5 shows, in a perspective view, the diamond body 1 according to FIG. 1 in a use with periodically arranged heat sources 28 as a component positioned in the center between the internal slits 9, 10 and the edge sides 2, 3, 4, 5, as well as short edge slits 8, with increased temperatures relative to the surroundings. The heat sources 28 are, for example, surface-emitting laser arrays, in which their electronic contact is not shown for reasons of clarity in FIG. 5. The heat sources 28 are provided with a cover 29 that extends over the heat sources 28 on their sides opposite diamond body 1, which together form a module with a heat expansion coefficient different from diamond.

The thermally induced mechanical stresses occurring because of temperature differences along the connection between two adjacent heat sources 28 during application of the component formed by the heat sources 28 and cover 29 to the diamond body 1 by heat exposure, for example, during soldering, are largely compensated by the intermediate internal slits 9, 10, as well as short edge slits 8, which extend partly at right angles and partly at 45 degrees between adjacent heat sources 28 during a reduction of the hazard of damage, in which the internal slits 9, 10, because of their essentially oblique alignment to the directions of heat flow running radially away from the heat sources 28, are aligned so that relatively good heat removal to a heat removal body (not shown in FIG. 5) applied to the side of diamond body 1 opposite heat sources 28 is ensured.

Figure 6:
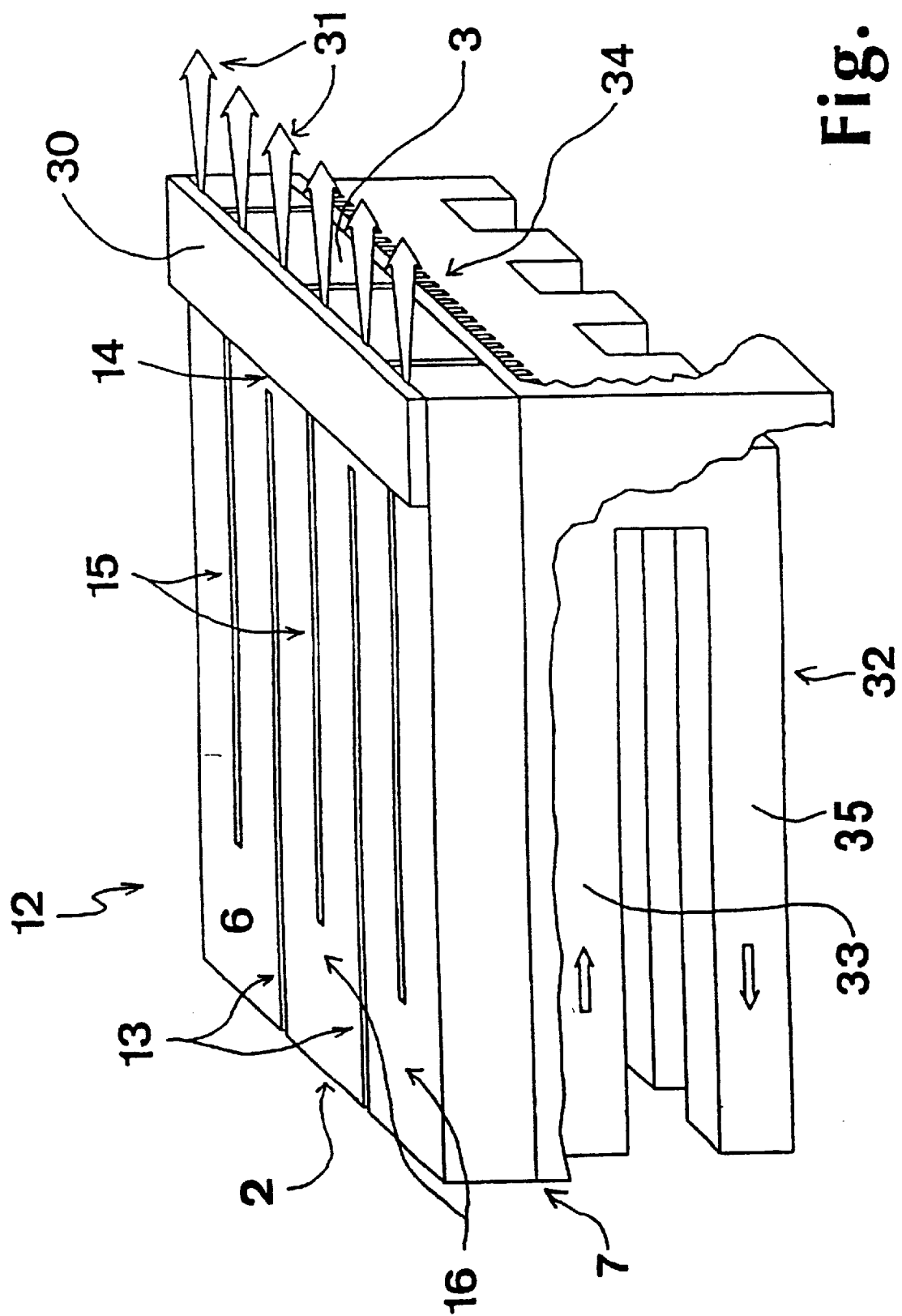
FIG. 6 shows a diamond body according to FIG. 2 with heat spreaders arranged between a laser diode bar and a microchannel cooler in a perspective view.

FIG. 6 shows, in a perspective view, the diamond body 12 according to FIG. 2, on which a laser diode bar 30 is applied adjacent to the second edge side 3 by hard soldering at a relatively high temperature. Because of the longitudinal edge slits 13, 15 extending at right angles to the second edge side 3 with the resulting meander-like structure, mechanical stresses, because of different heat expansion coefficients of the semiconductor material of the laser diode bar 30 and the diamond body 12, can be equalized during mechanical joining, so that the hazard of damage to the laser diode bar 30 is substantially reduced.

The spacings between optically active areas of the laser diode bar 30, from which laser radiation 31 can be emitted, depicted by the arrow, as well as between the second longitudinal edge slits 15 open to the second edge side 3 and the intermediate first longitudinal edge slits 13, are adjusted to each other for effective heat spreading of the power loss generated by the optically active areas as heat sources, so that each optically active area is arranged on sections of the diamond body 12 extending between two longitudinal edge slits 13, 15. A microchannel cooler 32 is applied to the cover side 7 of diamond body 12 opposite laser diode bar 30. Parallel aligned inflow lines 33 with microchannels 34 open to the second cover side 7 of diamond body 12, as well as outflow lines 35 connected to the inflow lines 33, are aligned parallel to the longitudinal edge slits 13, 15. Because of this, heat flow is obtained during operation of the laser diode bar 30 essentially parallel to the longitudinal edge slits 13, 15, whereas mechanical stresses occur transversely to this, so that, on the one hand, effective heat spreading occurs and, on the other hand, there is effective compensation of mechanical stresses.

What is claimed is:

1. A device for conducting heat away from at least one heat generating component, the device comprising:
    a substantially solid diamond body having at least one elongated slit, said diamond body having a connecting surface adapted to be connected to a heat generating component and an opposed surface which is substantially continuous and free of protrusions, said at least one elongate slit extending at an angle to said connecting surface thereby separating said connecting surface into at least two surface areas, said at least one elongated slit further extending between and through both said connecting surface and said opposed surface, whereby thermally induced mechanical stresses generated from connection to a said heat generating component are reduced.

2. A heat conducting device according to claim 1, wherein:
    at least one elongated slit is aligned at substantially a right angle to said connecting surface.

3. A heat conducting device according to claim 1, wherein:
    said at least one elongated slit comprises a plurality of parallel slits.

4. A heat conducting device according to claim 1, further comprising an edge surface substantially perpendicular to said connecting surface, said edge surface having a height,
    said at least one elongated slit having three open sides, one closed side, and a depth; wherein a residual material thickness between said closed side of said elongated slit and said edge surface is less than said height of said edge surface.

5. A heat conducting device according to claim 1, wherein:
    said diamond body has a shape chosen from the group consisting of cuboid shapes and cylindrical shapes.

6. A method of conducting heat from at least one heated area of a heat generating component, said method comprising:
    A) providing a diamond body having opposed surfaces which are substantially continuous and free of protrusions;
    B) determining the probable direction of mechanical stresses which will be thermally induced from connection of said diamond body to said at least one heated area of at least one heat generating component, and determining the probable direction of heat flow from said heat generating component through said diamond body;

C) fashioning at least one elongated slit in said diamond body, said at least one elongated slit extending at an angle to said probable direction of said thermally induced mechanical stresses and further extending between and through both said opposed surfaces;

D) positioning one of said opposed surfaces of said diamond body in contact with a said at least one heat generating component so that heat is conducted from said at least one component; and E) aligning said at least one elongated slit to extend at an angle in the range of 0–90 degrees relative to said probably direction of heat flow.

7. The method according to claim 6, wherein:

said at least one elongated slit comprises a plurality of parallel slits.

8. A method of conducting heat from at least one heated area of at least one heat generating component, said method comprising:

A) providing a diamond body having opposed surfaces which are substantially continuous and free of protrusions;

B) determining the probable direction of mechanical stresses which will be thermally induced from connection of said diamond body to said at least one heated area of at least one heat generating component, and determining the probable direction of heat flow from said heat generating component through said diamond body;

C) fashioning at least one elongated slit in said diamond body, said at least one elongated slit extending at an angle to said probable direction of said thermally induced mechanical stresses and further extending between and through both said opposed surfaces;

D) positioning one of said opposed surfaces of said diamond body in contact with a said at least one heat generating component so that heat is conducted from said at least one component; and E) aligning said at least one elongated slit to extend at an angle relative to said probable direction of said thermally induced mechanical stresses, said angle being greater than the angle of said probable direction of heat flow.

* * * * *